United States Patent [19]
Ooishi

[11] Patent Number: 5,700,734
[45] Date of Patent: Dec. 23, 1997

[54] PROCESS OF FABRICATING FIELD EFFECT TRANSISTOR HAVING RELIABLE POLYCIDE GATE ELECTRODE

[75] Inventor: Mitsuma Ooishi, Tokyo, Japan

[73] Assignee: NEC Corporation, Japan

[21] Appl. No.: 670,766

[22] Filed: Jun. 24, 1996

[30] Foreign Application Priority Data

Jun. 26, 1995 [JP] Japan .................................. 7-159463

[51] Int. Cl.⁶ .............................................. H01L 21/3205
[52] U.S. Cl. ...................................... 438/592; 438/305
[58] Field of Search ................................. 438/197, 299, 438/301, 303, 305, 585, 592

[56] References Cited

U.S. PATENT DOCUMENTS

| | | | |
|---|---|---|---|
| 4,444,617 | 4/1984 | Whitcomb | 438/592 |
| 4,680,086 | 7/1987 | Thomas et al. | 438/592 |
| 4,698,126 | 10/1987 | Van Roosmalen et al. | 438/592 |
| 5,188,980 | 2/1993 | Lai | 438/592 |
| 5,346,586 | 9/1994 | Keller | 438/592 |
| 5,368,686 | 11/1994 | Tatsumi | 438/592 |
| 5,438,006 | 8/1995 | Chang et al. | 438/592 |
| 5,441,914 | 8/1995 | Taft et al. | 438/592 |

OTHER PUBLICATIONS

"Degradation of MOS Characteristics Caused by Internal Stresses in Gate Electrodes" Yamamoto; Extended Abstracts of the 19th Conference on Solid State Devices and Materials, Tokyo, 1987, pp. 415–418.

*Primary Examiner*—Charles L. Bowers, Jr.
*Assistant Examiner*—Toniae M. Thomas
*Attorney, Agent, or Firm*—Hayes, Soloway, Hennessey, Grossman & Hage, P.C.

[57] ABSTRACT

A field effect transistor has a polycide structure having a doped polysilicon strip on a gate oxide layer and a crystal tungsten silicide strip on the doped polysilicon strip, and the polycide structure is formed through a process sequence having the steps of patterning an amorphous tungsten silicide layer into an amorphous tungsten silicide strip, crystallizing the amorphous tungsten silicide strip and patterning a doped polysilicon layer into the doped polysilicon strip, thereby preventing the crystal tungsten silicide strip from undesirable warp without contamination of the gate oxide layer.

10 Claims, 6 Drawing Sheets

PROCESS OF FABRICATING FIELD EFFECT TRANSISTOR HAVING RELIABLE POLYCIDE GATE ELECTRODE

FIELD OF THE INVENTION

This invention relates to a process of fabricating a field effect transistor and, more particularly, to a process of fabricating a field effect transistor having a reliable polycide gate electrode.

DESCRIPTION OF THE RELATED ART

A polycide gate electrode or a laminated structure of a polysilicon layer and a refractory metal silicide layer is attractive for reducing a resistance against an input signal. FIGS. 1A to 1C illustrate a first prior art process of fabricating a polycide gate electrode. Firstly, a surface portion of a p-type silicon substrate 1 is thermally oxidized, and a gate oxide layer 2 is grown to 8 to 20 nanometers in thickness. Subsequently, polysilicon is deposited to 50 to 200 nanometers thick over the gate oxide layer 2, and the gate oxide layer 2 is overlain by a polysilicon layer 3. Finally, amorphous tungsten silicide is deposited to 100 to 300 nanometers thick over the polysilicon layer 3 by using a sputtering technique or a chemical vapor deposition technique, and the polysilicon layer 3 is covered with an amorphous tungsten silicide layer 4. The amorphous tungsten silicide is expressed by the chemical formula of WSix, and x ranges from 2 to 3. The resultant structure is illustrated in FIG. 1A.

Photo-resist is spread over the entire surface of the tungsten silicon layer 4, and the photo-resist layer is developed into a photo-resist etching mask 5. Using the photo-resist etching mask 5, the tungsten silicide layer 4 and the polysilicon layer 3 are partially etched away, and a polysilicon strip 3a and a tungsten silicide strip 4a are left on the gate oxide layer 2 as shown in FIG. 1B.

The photo-resist etching mask 5 is stripped off, and the amorphous tungsten silicide strip 4a is recrystallized as follows. The resultant structure is placed in a furnace 6a, and inert gas is introduced into the furnace 6a. A heater unit 6b heats the amorphous tungsten silicide strip 4a to 800 degrees to 950 degrees in centigrade as shown in FIG. 1C. The heat treatment recrystallizes the amorphous tungsten silicide strip 4a, and the crystal tungsten silicide strip 4b and the polysilicon strip 3a form in combination a polycide gate electrode 7.

If the amorphous tungsten silicide strip 4a is recrystallized in oxidizing atmosphere, silicon oxide is grown on the side surfaces of the polysilicon strip 3a during the recrystallization.

The first prior art process encounters problems in a contamination of the gate oxide layer 2 and a stress concentration at the interface between the gate oxide layer 2 and the polysilicon strip 3a. The stress concentration gives rise to segregation of dopant impurity at the interface, and the segregation lowers the withstand voltage of the gate oxide layer. The contamination and the stress concentration are derived from the fact that the polysilicon layer 3 and the amorphous tungsten silicide layer 4 are patterned before the annealing.

Another prior art process is disclosed by Naoki Yamamoto in "Degradation of MOS Characteristics Caused by Internal Stress in Gate Electrodes", Extended Abstracts of the 19th Conference on Solid State Devices and Materials, Tokyo, 1987, pages 415 to 418, and FIGS. 2A to 2C illustrates the second prior art process disclosed therein.

The second process starts with preparation of a p-type silicon substrate 11, and a gate oxide layer 12, a polysilicon layer 13 and an amorphous tungsten silicide layer 14a are grown on the p-type silicon substrate 11 as shown in FIG. 2A.

Subsequently, the amorphous tungsten silicide layer 14a is annealed in inert atmosphere at 800 degrees to 950 degrees in centigrade, and is converted to a crystal tungsten silicide layer 14b as shown in FIG. 2B.

Finally, the polysilicon layer 13 and the crystal tungsten silicide layer 14b are patterned through lithographic techniques, and a polycide gate electrode 15 or a laminated structure of a polysilicon strip 13a and a crystal tungsten silicide strip 14c is left on the gate oxide layer 12 as shown in FIG. 2C.

The polycide gate structure 15 is patterned from the lamination after the annealing, and, accordingly, the second prior art process is free from the problems inherent in the first prior art process. However, as described in the paper, the amorphous tungsten silicide layer 14a expressed as $WSi_{3.0}$ is deposited to 300 nanometers thick by using the low-pressure chemical vapor deposition technique, and a tensile stress takes place in the as-deposited amorphous tungsten silicide layer 14a. The tensile stress is of the order of $5 \times 10^8$ N/m². When the amorphous tungsten silicide layer is annealed at 900 degrees in centigrade, the tensile stress is increased to $1 \times 10^9$ N/m². When the field effect transistors are fabricated on a large-diameter silicon wafer, the crystal tungsten silicide layer 14b tends to peel off due to the large amount of tensile stress. An ultra large scale integration of the next generation is formed by a large number of miniature field effect transistors, and the polycide gate electrode requires a thick tungsten silicide strip so as to keep the input signal line low-resistance. The thicker the tungsten silicide layer is, the larger the tensile stress is. The large tensile stress damages the field effect transistors, and the miniature field effect transistor requires a new process which is free from not only the problems inherent in the first prior art process but also the problem inherent in the second prior art process.

SUMMARY OF THE INVENTION

It is therefore an important object of the present invention to provide a process of fabricating a field effect transistor a tungsten silicide layer of which does not peel off without the contamination of a gate insulating layer and the stress concentration at the interface between the gate insulating layer and a polysilicon layer.

To accomplish the object, the present invention proposes to recrystallize amorphous refractory metal silicide strip between a patterning stage of an amorphous refractory metal silicide layer and a patterning stage of a silicon layer.

In accordance with the present invention, there is provided a process of fabricating a field effect transistor on a semiconductor layer, comprising the steps of: a) forming a laminated structure on the semiconductor layer, the laminated structure including a gate insulating layer, a silicon layer and an amorphous refractory metal silicide layer; b) patterning a laminated sub-structure including the amorphous refractory metal silicide layer into a primitive gate sub-structure including an amorphous refractory metal silicide strip patterned from the amorphous refractory metal silicide layer; c) crystallizing the amorphous refractory metal silicide strip so as to provide a gate sub-structure including a crystal refractory metal silicide strip on the silicon layer; and d) patterning the silicon layer into a silicon strip on the gate insulating layer, the crystal refractory metal silicide strip and the silicon strip forming a gate structure.

BRIEF DESCRIPTION OF THE DRAWINGS

The features and advantages the process according to the present invention will be more clearly understood from the following description taken in conjunction with the accompanying drawings in which.

DESCRIPTION OF THE PREFERRED EMBODIMENTS

First Embodiment

FIGS. 3A to 3F illustrate a process embodying the present invention. The process starts with preparation of an 8-inch p-type silicon wafer 21 serving as a semiconductor substrate. Though now shown in the figures, a field oxide layer is selectively grown on the p-type silicon wafer 21, and defines a plurality of active areas. One of the active areas is assigned to a field effect transistor, and description is focused on this field effect transistor.

The p-type silicon wafer 21 is placed in an oxidizing atmosphere, and silicon oxide is grown on the active area. The silicon oxide forms a gate insulating layer 22, and the gate insulating layer 22 ranges from 8 nanometers to 15 nanometers in thickness.

Subsequently, phosphorous-doped polysilicon is deposited to 20 nanometers to 150 nanometers thick over the entire surface by using a chemical vapor deposition, and the gate insulating layer 22 is overlain by a phosphorous-doped polysilicon layer 23a.

Amorphous tungsten silicide is deposited to 100 nanometers to 300 nanometers thick over the phosphorous-doped polysilicon layer 23a by using a chemical vapor deposition or a sputtering, and the phosphorous-doped polysilicon layer 23a is overlain by an amorphous tungsten silicide layer 24a expressed as $WSi_x$.

Figure 1A:
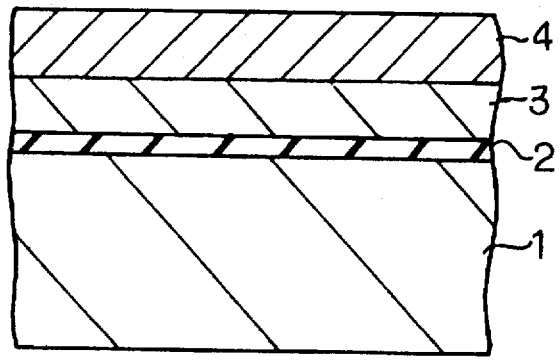
FIGS. 1A to 1C are cross sectional views showing the first prior art process.
Figure 1B:
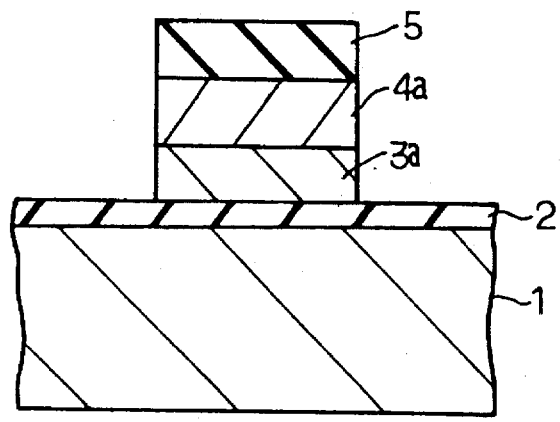
Figure 1C:
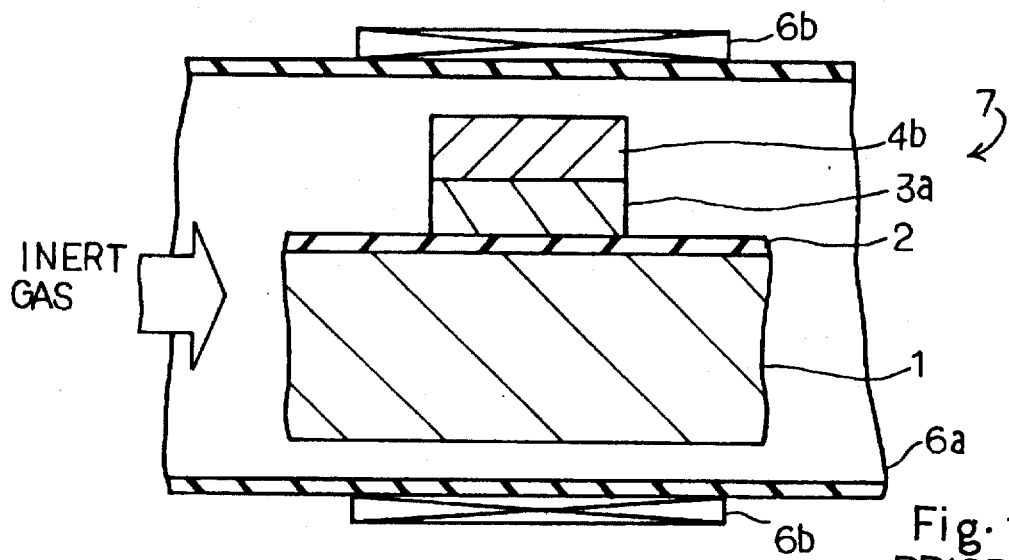
Figure 2A:
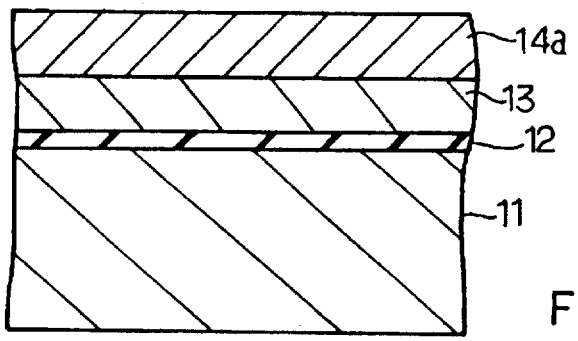
FIGS. 2A to 2C are cross sectional views showing the second prior art process.
Figure 2B:
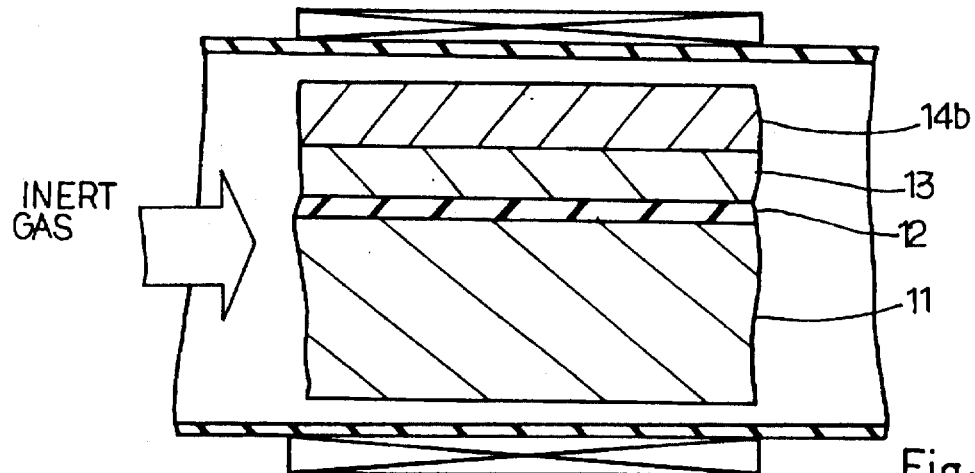
Figure 2C:
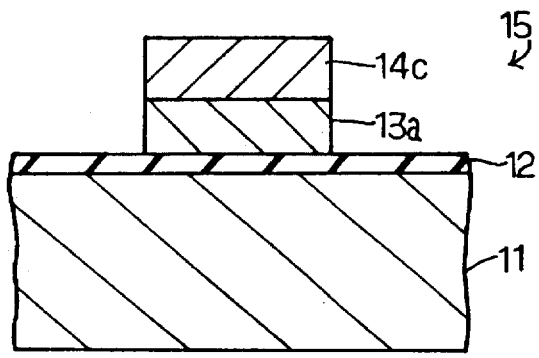
Figure 3A:
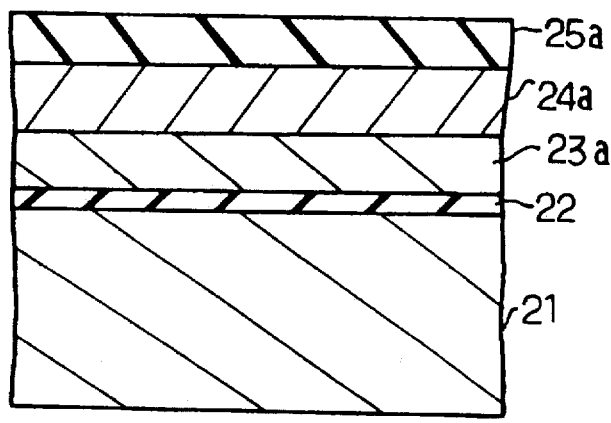
FIGS. 3A to 3F are cross sectional views showing a process of fabricating a field effect transistor according to the present invention.

Silicon oxide is deposited to 10 nanometers to 20 nanometers thick over the amorphous tungsten silicide layer 24a by using a chemical vapor deposition, and the amorphous tungsten silicide layer 24a is covered with a silicon oxide layer 25a. The resultant structure of this stage is illustrated in FIG. 3A. In this instance, the amorphous tungsten silicide layer 24a and the silicon oxide layer 25a form in combination a laminated sub-structure.

Figure 3B:
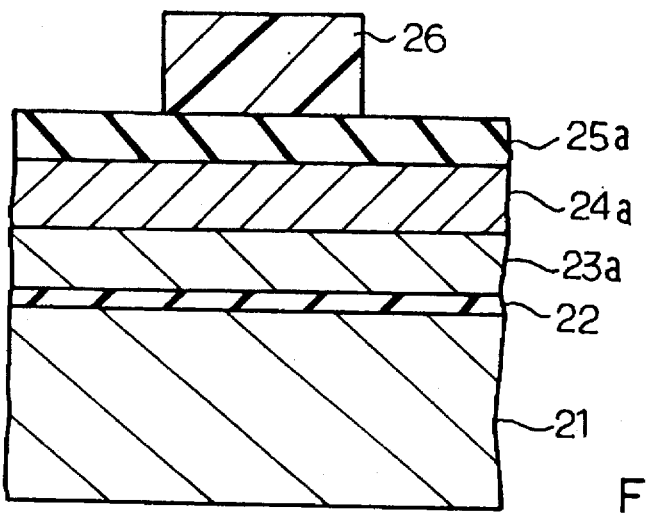

Photo-resist solution is spread over the entire surface of the silicon oxide layer 25a, and is baked so as to form a photo-resist layer (not shown) on the silicon oxide layer 25a. A pattern image for a gate structure is transferred from a reticle (not shown) to the photo-resist layer, and the pattern image includes the minimum pattern ranging between 0.3 micron to 0.6 micron. When the pattern image is developed, the photo-resist layer is patterned into a photo-resist mask 26 as shown in FIG. 3B.

Figure 3C:
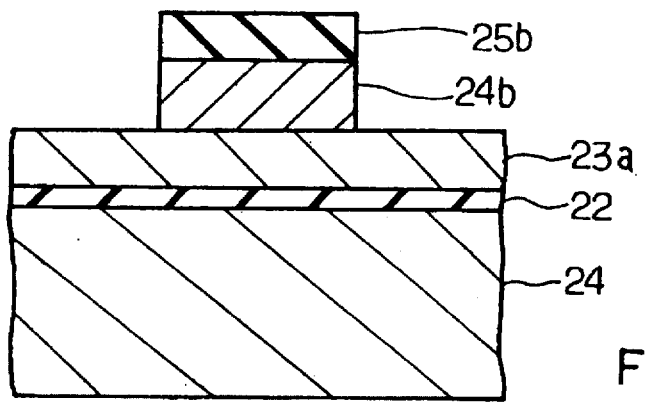

Using the photo-resist mask 26, the silicon oxide layer 25a and the tungsten silicide layer 24a are partially etched away by using anisotropic dry etching techniques, and an amorphous tungsten silicide strip 24b and a silicon oxide strip 25b are left on the phosphorous-doped polysilicon layer 23a. The silicon oxide strip 25b serves as an etching mask in a later stage for patterning the phosphorous-doped polysilicon layer 23a. The amorphous tungsten silicide strip 24b and the silicon oxide strip 25b serve as a primitive gate sub-structure. The photo-resist mask 26 is stripped off, and the resultant structure is illustrated in FIG. 3C.

Figure 3D:
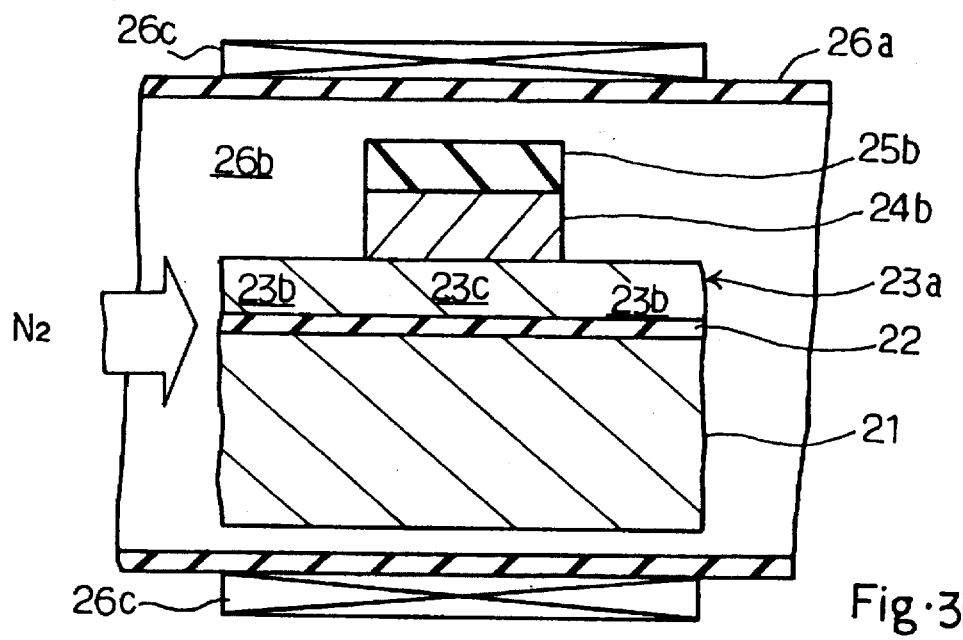

Subsequently, the amorphous tungsten silicide is recrystallized. The resultant structure shown in FIG. 3C is placed in a furnace 26a, and nitrogen gas is introduced into the furnace chamber 26b as shown in FIG. 3D. A heater unit 26c heats the amorphous tungsten silicide strip 24b to 800 to 950 degrees in centigrade, and the amorphous tungsten silicide is recrystallized. As a result, the amorphous tungsten silicide strip 24b is converted to a crystal tungsten silicide strip 24c. The crystal tungsten silicide strip 24c is lower in resistivity than the amorphous tungsten silicide strip 24b.

While the amorphous tungsten silicide strip 24b is being recrystallized, the phosphorous-doped polysilicon layer is exposed to contaminant. Both side portions 23b of the phosphorous-doped polysilicon layer 23a are uncovered with the amorphous tungsten silicide strip 24b, and are much contaminated, because both side portions 23b are directly exposed to the contaminant. However, the central portion 23c beneath the amorphous tungsten silicide strip 24b is less contaminated, and, accordingly, the gate insulating layer 22 therebeneath is prevented from the contaminant.

The heat treatment for the recrystallization further causes a stress to take place. The stress is concentrated around the side edges of the crystal tungsten silicide strip 24c, and the phosphorous is segregated there. However, the segregation hardly attains to the interface between the gate insulating layer 22 and the phosphrous-doped polysilicon strip 23a. For this reason, the withstand voltage of the gate insulating layer 22 is not lowered, and the field effect transistor is reliable.

Moreover, even though the stress unavoidablly takes place due to the recrystallization, the crystal tungsten silicide strip 24c hardly peels off, because the dimensions are decreased through the patterning already carried out.

Subsequently, the phosphorous-doped polysilicon layer 23a is patterned. Using the silicon oxide strip 25b as an etching mask, the phosphorous-doped polysilicon layer 23a is subjected to an anisotropic dry etching, and both side portions 23b are removed. As a result, a phosphorous-doped polysilicon strip 23d is formed from the phosphrous-doped polysilicon layer 23a, and the phosphorous-doped polysilicon strip 23d and the crystal tungsten silicide strip 24c are exactly overlapped with each other, because the silicon oxide strip 25b and the amorphous tungsten silicide strip 24b are patterned by using the photo-resist etching mask 26. The phosphorous-doped polysilicon strip 23d and the crystal tungsten silicide strip 24c form in combination a polycide gate structure 27.

Figure 3E:
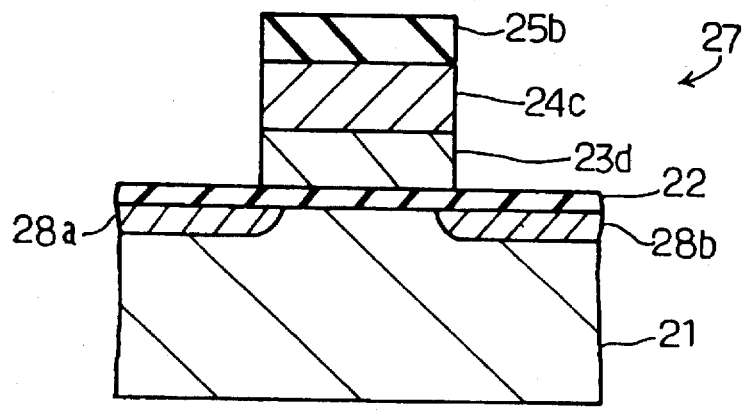

Subsequently, phosphorous is ion implanted into the p-type silicon substrate at dose of $1\times10^{13}$ to $5\times10^{13}$ $cm^{-2}$ under acceleration energy of 30 KeV to 50 KeV, and lightly doped source/drain regions 28a/28b are formed in the p-type silicon substrate 21 as shown in FIG. 3E.

Figure 3F:
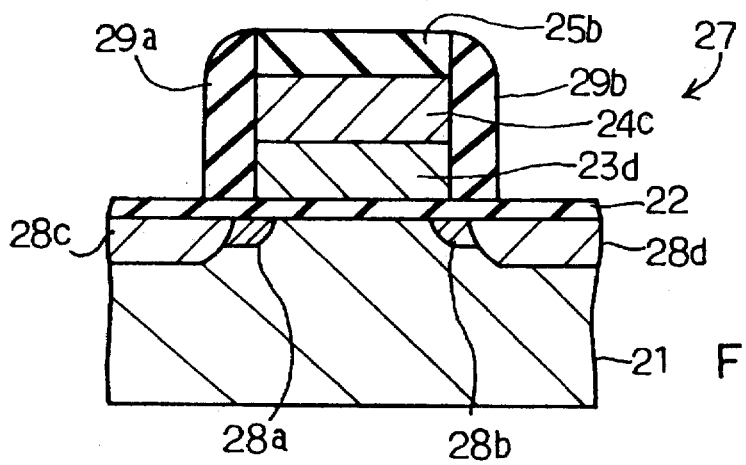

Silicon oxide is deposited to 70 to 200 nanometers thick over the entire surface of the structure by using a chemical vapor deposition, and the silicon oxide layer is anisotropically etched without an etching mask. The anisotropic dry etching forms side wall spacers 29a and 29b on both side surfaces of the polycide gate structure 27, and arsenic is ion implanted into the p-type silicon substrate 21 at dose of $1\times10^{15}$ to $1\times10^{16}$ cm$^{-2}$ under acceleration energy of 30 KeV to 70 KeV. Heavily doped source/drain regions 28c/28d are formed in the p-type silicon substrate 21, and are partially overlapped with the lightly doped source/drain regions 28a/28b as shown in FIG. 3F.

As will be understood from the foregoing description, the crystallization is carried out between the patterning stage of the amorphous tungsten silicide layer 24a and the patterning stage of the phosphorous-doped polysilicon layer 23a according to the present invention. By virtue of the process sequence according to the present invention, the phosphorous-doped polysilicon strip 23d is less contaminated, and the stress concentration is localized around the edges of the crystal tungsten silicide strip 24c. For this reason, the gate insulating layer is free from the undesirable influence of the segregation due to the stress concentration. Moreover, only the patterned tungsten silicide strip is recrystallized, and the crystal tungsten silicide strip hardly peels off.

Second Embodiment

FIGS. 4A to 4F illustrate another process embodying the present invention. The process starts with preparation of an 8-inch p-type silicon wafer 31 serving as a substrate. Though now shown in the figures, a field oxide layer is selectively grown on the p-type silicon wafer 31, and defines a plurality of active areas. One of the active areas is assigned to a field effect transistor, and description is focused on this field effect transistor.

The p-type silicon wafer 31 is placed in an oxidizing atmosphere, and silicon oxide is grown on the active area. The silicon oxide forms a gate insulating layer 32, and the gate insulating layer 32 ranges from 8 nanometers to 15 nanometers in thickness.

Subsequently, phosphorous-doped polysilicon is deposited to 20 nanometers to 150 nanometers thick over the entire surface by using a chemical vapor deposition, and the gate insulating layer 32 is overlain by a phosphorous-doped polysilicon layer 33a.

Amorphous tungsten silicide is deposited to 100 nanometers to 300 nanometers thick over the phosphorous-doped polysilicon layer 33a by using a chemical vapor deposition or a sputtering, and the phosphorous-doped polysilicon layer 33a is overlain by an amorphous tungsten silicide layer 34a expressed as WSi$_x$.

Figure 4A:
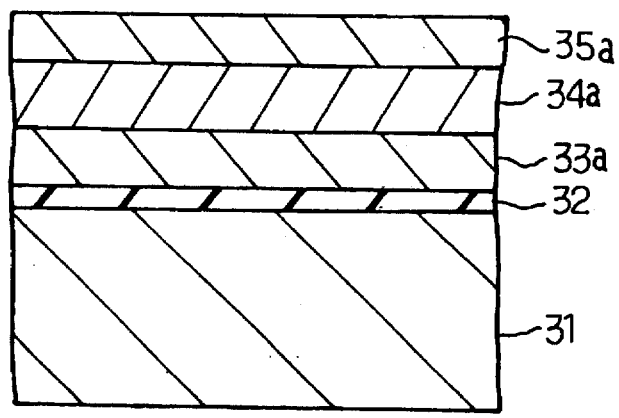
FIGS. 4A to 4F are cross sectional views showing another process of fabricating a field effect transistor according to the present invention.

Silicon such as polysilicon is deposited to 20 nanometers to 150 nanometers thick over the amorphous tungsten silicide layer 34a by using a sputtering, and the amorphous tungsten silicide layer 34a is covered with a silicon layer 35a. The silicon layer 35a is equal in thickness to the phosphorous-doped polysilicon layer 33a. The resultant structure of this stage is illustrated in FIG. 4A. In this instance, the amorphous tungsten silicide layer 34a and the silicon layer 35a form in combination a laminated sub-structure.

Figure 4B:
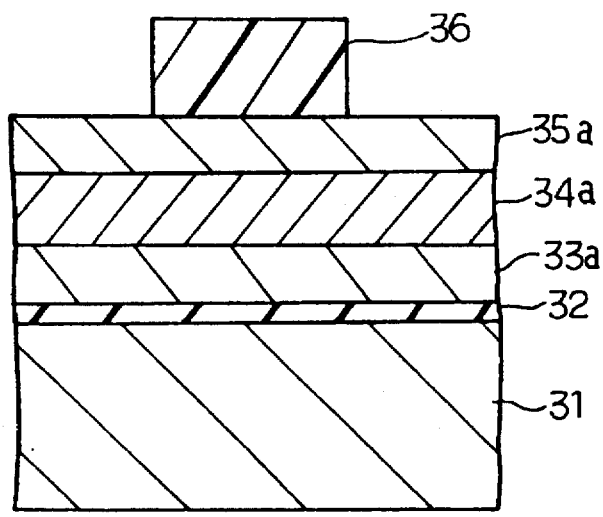

Photo-resist solution is spread over the entire surface of the silicon layer 35a, and is baked so as to form a photo-resist layer (not shown) on the silicon layer 35a. A pattern image for a gate structure is transferred from a reticle (not shown) to the photo-resist layer, and the pattern image includes the minimum pattern ranging between 0.3 micron to 0.6 micron. When the pattern image is developed, the photo-resist layer is patterned into a photo-resist mask 36 as shown in FIG. 4B.

Figure 4C:
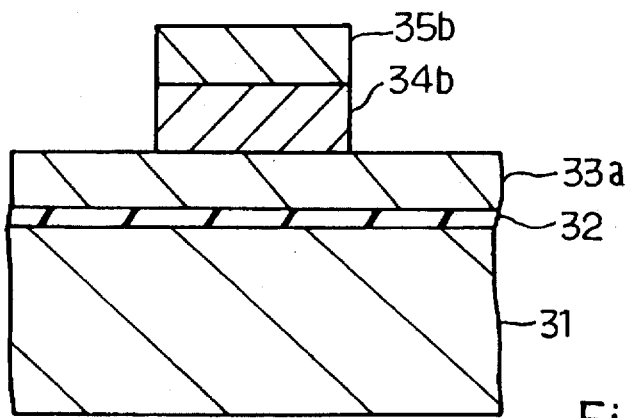

Using the photo-resist mask 36, the silicon layer 35a and the tungsten silicide layer 34a are partially etched away by using anisotropic dry etching techniques, and an amorphous tungsten silicide strip 34b and a silicon strip 35b are left on the phosphorous-doped polysilicon layer 33a. The silicon strip 35b is used as a mask concurrently etched away together with both end portions of the phosphorous-doped polysilicon layer 33a in a later stage. The amorphous tungsten silicide strip 34b and the silicon strip 35b serve as a primitive gate sub-structure. The photo-resist mask 36 is stripped off, and the resultant structure is illustrated in FIG. 4C.

Figure 4D:
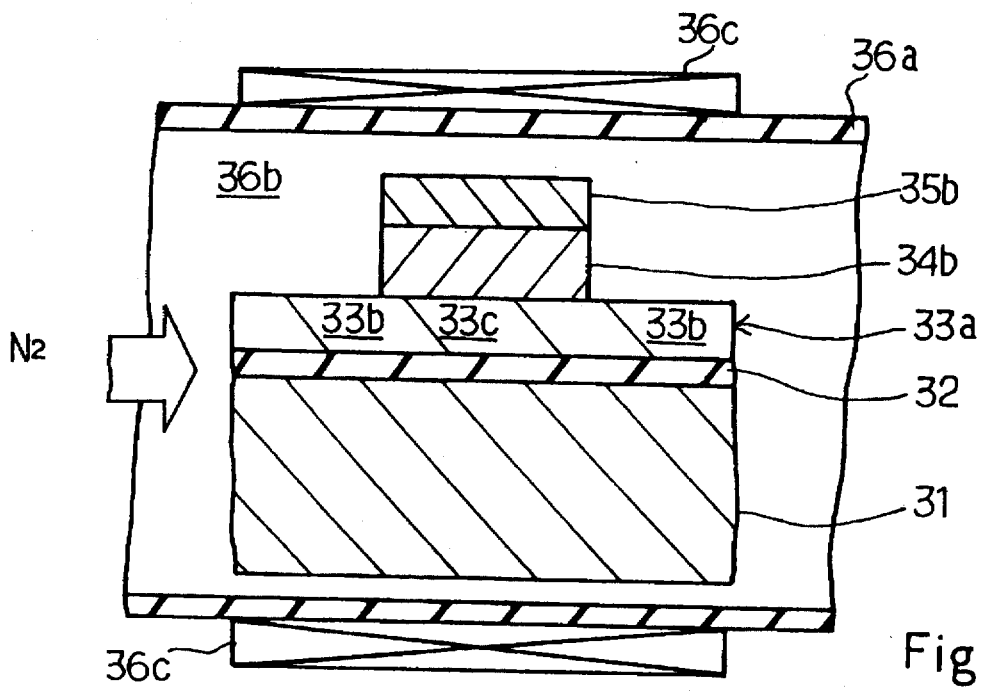

Subsequently, the amorphous tungsten silicide is recrystallized. The resultant structure shown in FIG. 4C is placed in a furnace 36a, and nitrogen gas is introduced into the furnace chamber 36b as shown in FIG. 4D. A heater unit 36c heats the amorphous tungsten silicide strip 34b to 800 to 950 degrees in centigrade, and the amorphous tungsten silicide is recrystallized. As a result, the amorphous tungsten silicide strip 34b is converted to a crystal tungsten silicide strip 34c. The crystal tungsten silicide strip 34c is lower in resistivity than the amorphous tungsten silicide strip 34b.

While the amorphous tungsten silicide strip 34b is being recrystallized, the phosphorous-doped polysilicon layer 33a is exposed to contaminant. Both side portions 33b of the phosphrous-doped polysilicon layer 33a are uncovered with the amorphous tungsten silicide strip 34b, and are much contaminated, because both side portions 33b are directly exposed to the contaminant. However, the central portion 33c beneath the amorphous tungsten silicide strip 34b is less contaminated, and, accordingly, the gate insulating layer 32 therebeneath is prevented from the contaminant.

The heat treatment for the recrystallization further causes a stress to take place. The stress is concentrated around the side edges of the crystal tungsten silicide strip 34c, and the phosphorous is segregated there. However, the segregation hardly attains to the interface between the gate insulating layer 32 and the phosphrous-doped polysilicon strip 33a. For this reason, the withstand voltage of the gate insulating layer 32 is not lowered, and the field effect transistor is reliable.

Moreover, even though the stress unavoidablly takes place due to the recrystallization, the crystal tungsten silicide strip 34c hardly peels off, because the dimensions are decreased through the patterning already carried out.

Subsequently, the phosphorous-doped polysilicon layer 33a is patterned. Using the silicon strip 35b as an etching mask, the phosphorous-doped polysilicon layer 33a is subjected to an anisotropic dry etching, and both side portions 33b and the silicon strip 35b are removed. As a result, a phosphorous-doped polysilicon strip 33d is formed from the phosphrous-doped polysilicon layer 33a, and the phosphorous-doped polysilicon strip 33d and the crystal tungsten silicide strip 34c are exactly overlapped with each other, because the silicon strip 35b and the amorphous tungsten silicide strip 34b are patterned by using the photo-resist etching mask 36. The silicon strip 35b is etched away together with both side portions 33b, and the silicon is never left on the crystal tungsten silicide strip 34c. The phosphorous-doped polysilicon strip 33d and the crystal tungsten silicide strip 34c form in combination a polycide gate structure 37.

Figure 4E:
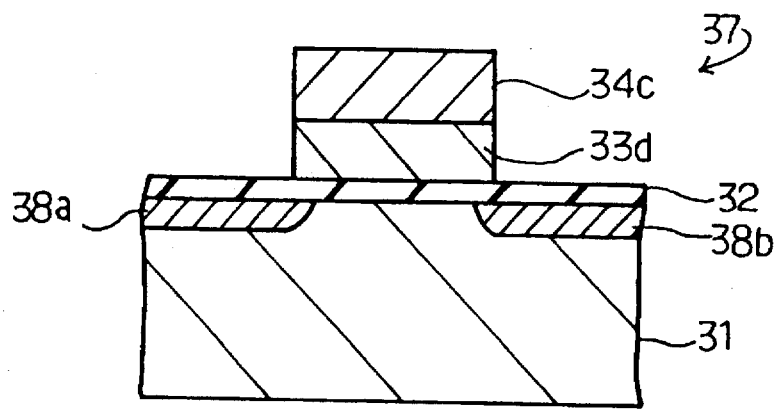

Subsequently, phosphorous is ion implanted into the p-type silicon substrate at dose of $1\times10^{13}$ to $5\times10^{13}$ cm$^{-2}$ under acceleration energy of 30 KeV to 50 KeV, and lightly doped source/drain regions 38a/38b are formed in the p-type silicon substrate 31 as shown in FIG. 4E.

Figure 4F:
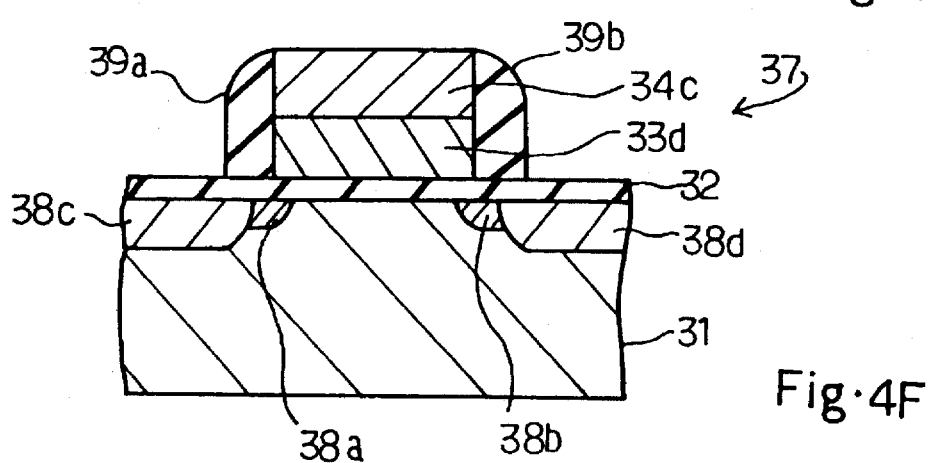

Silicon oxide is deposited to 70 to 200 nanometers thick over the entire surface of the structure by using a chemical vapor deposition, and the silicon oxide layer is anisotropically etched without an etching mask. The anisotropic dry etching forms side wall spacers 39a and 39b on both side surfaces of the polycide gate structure 37, and arsenic is ion implanted into the p-type silicon substrate 31 at dose of $1\times 10^{15}$ to $1\times 10^{16}$ cm$^{-2}$ under acceleration energy of 30 KeV to 70 KeV. Heavily doped source/drain regions 38c/38d are formed in the p-type silicon substrate 31, and are partially overlapped with the lightly doped source/drain regions 38a/38b as shown in FIG. 4F.

The second process sequence achieves all the advantages of the first embodiment. The polycide gate structure 37 is lower than the polycide gate structure 27, and an upper surface of an inter-level insulating layer (not shown) is smoother than that of the first embodiment.

Although particular embodiments of the present invention have been shown and described, it will be obvious to those skilled in the art that various changes and modifications may be made without departing from the spirit and scope of the present invention.

Titanium silicide expressed as TiSi$_x$, molybdenum silicide expressed as MoSi$_x$ or cobalt silicide expressed as CoSi$_x$ is available for the polycide gate structure according to the present invention. The gate insulating layer may be formed of silicon nitride.

If the lithography is twice repeated for the tungsten silicide layer and the polysilicon layer, the silicon oxide layer and the silicon layer are not deposited over the amorphous tungsten silicide layer.

The silicon layer 35a is replaceable with a layer of any substance in so far as there is an etchant having a small selectivity between the substance and the polysilicon. However, the thickness of the layer should be regulated to an appropriate value in consideration of the selectivity to the polysilicon.

What is claimed is:

1. A process of fabricating a field effect transistor on a semiconductor layer, comprising the steps of:
   a) forming a laminated structure on said semiconductor layer, said laminated structure including a gate insulating layer, a silicon layer and an amorphous refractory metal silicide layer;
   b) patterning a laminated sub-structure including said amorphous refractory metal silicide layer into a primitive gate sub-structure including an amorphous refractory metal silicide strip patterned from said amorphous refractory metal silicide layer;
   c) crystallizing said amorphous refractory metal silicide strip so as to provide a gate sub-structure including a crystal refractory metal silicide strip on said silicon layer; and
   d) patterning said silicon layer into a silicon strip on said gate insulating layer, said crystal refractory metal silicide strip and said silicon strip forming a gate structure.

2. The process as set forth in claim 1, in which said laminated structure further has a layer of a substance on said amorphous refractory metal silicide layer, and said layer of said substance is patterned to a mask layer provided on said amorphous refractory metal silicide strip in said step b), said mask layer being used as an etching mask in said step d).

3. The process as set forth in claim 2, in which said substance is silicon oxide so as to leave said mask layer on said crystal refractory metal silicide strip upon completion of said step d).

4. The process as set forth in claim 2, in which said substance is silicon so as to be etched away together with portions of said silicon layer on both sides of said silicon strip in said step d).

5. The process as set forth in claim 1, further comprising the step of e) introducing a dopant impurity into said semiconductor layer in a self-aligned manner with said gate structure so as to form first source and drain regions in said semiconductor layer.

6. The process as set forth in claim 5, further comprising the steps of:
   f) forming side wall spacers of an insulating substance on both side surfaces of said gate structure; and
   g) introducing a dopant impurity into said semiconductor layer in a self-aligned manner with said side wall spacers provided on both side surfaces of said gate structure so as to form second source and drain regions heavier in dopant impurity than said first source and drain regions and partially overlapped with said first source and drain regions, respectively.

7. The process as set forth in claim 1, in which said refractory metal silicide is selected from the group consisting of tungsten silicide, titanium silicide, molybdenum silicide and cobalt silicide.

8. The process as set forth in claim 1, in which said gate insulating layer is formed of an insulating substance selected from the group consisting of silicon oxide and silicon nitride.

9. A process of fabricating a field effect transistor on a silicon substrate of one conductivity type, comprising the steps of:
   a) forming a laminated structure including a gate insulating layer on said silicon substrate, a doped polysilicon layer on said gate insulating layer, an amorphous tungsten silicide layer on said doped polysilicon layer and a silicon oxide layer on said amorphous tungsten silicide layer;
   b) providing an etching mask on said silicon oxide layer;
   c) patterning said silicon oxide layer and said amorphous tungsten silicide layer into an amorphous tungsten silicide strip on said doped polysilicon layer and a silicon oxide strip on said amorphous tungsten silicide strip;
   d) applying heat to said amorphous tungsten silicide strip so as to convert said amorphous tungsten silicide strip to a crystal tungsten silicide strip;
   e) patterning said doped polysilicon layer into a doped polysilicon strip on said gate insulating layer by using said silicon oxide layer as an etching mask, said crystal tungsten silicide strip and said doped polysilicon strip forming a gate structure;
   f) introducing a first dopant impurity into said silicon substrate so as to form lightly doped source and drain regions of the opposite conductivity type self-aligned with said gate structure;
   g) forming side wall spacers of silicon oxide on both side surfaces of said gate structure; and
   h) introducing a second dopant impurity into said silicon substrate so as to form heavily doped source and drain regions of said opposite conductivity type self-aligned with said side wall spacers formed on both side surfaces of said gate structure.

10. A process of fabricating a field effect transistor on a silicon substrate of one conductivity type, comprising the steps of:
   a) forming a laminated structure including a gate insulating layer on said silicon substrate, a doped polysilicon layer on said gate insulating layer, an amorphous tungsten silicide layer on said doped polysilicon layer and a silicon layer on said amorphous tungsten silicide layer;

b) providing an etching mask on said silicon oxide layer;

c) patterning said silicon layer and said amorphous tungsten silicide layer into an amorphous tungsten silicide strip on said doped polysilicon layer and a silicon strip on said amorphous tungsten silicide strip;

d) applying heat to said amorphous tungsten silicide strip so as to convert said amorphous tungsten silicide strip to a crystal tungsten silicide strip;

e) patterning said doped polysilicon layer into a doped polysilicon strip on said gate insulating layer by using said silicon layer as an etching mask, said crystal tungsten silicide strip and said doped polysilicon strip forming a gate structure;

f) introducing a first dopant impurity into said silicon substrate so as to form lightly doped source and drain regions of the opposite conductivity type self-aligned with said gate structure;

g) forming side wall spacers of silicon oxide on both side surfaces of said gate structure; and h) introducing a second dopant impurity into said silicon substrate so as to form heavily doped source and drain regions of said opposite conductivity type self-aligned with said side wall spacers formed on both side surfaces of said gate structure.

* * * * *